(12) United States Patent
Chan et al.

(10) Patent No.: US 7,989,298 B1
(45) Date of Patent: Aug. 2, 2011

(54) TRANSISTOR HAVING V-SHAPED EMBEDDED STRESSOR

(75) Inventors: Kevin K. Chan, Staten Island, NY (US); Brian J. Greene, Wappingers Falls, NY (US); Judson R. Holt, Wappingers Falls, NY (US); Jeffrey B. Johnson, Essex Junction, NY (US); Thomas S. Kanarsky, Hopewell Junction, NY (US); Jophy S. Koshy, Wappingers Falls, NY (US); Kevin McStay, Hopewell Junction, NY (US); Dae-Gyu Park, Poughquag, NY (US); Johan W. Weijtmans, Hopewell Junction, NY (US); Frank B. Yang, Mahwah, NJ (US)

(73) Assignees: International Business Machines Corporation, Armonk, NY (US); Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 12/692,859

(22) Filed: Jan. 25, 2010

(51) Int. Cl.
*H01L 21/336* (2006.01)
*H01L 21/76* (2006.01)

(52) U.S. Cl. ........ 438/300; 438/222; 438/285; 438/429; 257/E21.43; 257/E21.409

(58) Field of Classification Search .................. 438/222, 438/285, 300, 429
See application file for complete search history.

(56) References Cited

U.S. PATENT DOCUMENTS

| | | | | |
|---|---|---|---|---|
| 7,485,524 | B2 * | 2/2009 | Luo et al. | 438/230 |
| 2009/0039390 | A1 * | 2/2009 | Murthy et al. | 257/190 |
| 2009/0152590 | A1 * | 6/2009 | Adam et al. | 257/192 |
| 2010/0093147 | A1 * | 4/2010 | Liao et al. | 438/300 |
| 2010/0109044 | A1 * | 5/2010 | Tekleab et al. | 257/190 |
| 2010/0117159 | A1 * | 5/2010 | Lindsay | 257/369 |
| 2011/0031503 | A1 * | 2/2011 | Doris et al. | 257/77 |

* cited by examiner

*Primary Examiner* — Alexander G Ghyka
(74) *Attorney, Agent, or Firm* — Yuanmin Cai; Daryl Neff

(57) ABSTRACT

A semiconductor device and a method of making the device are provided. The method can include forming a gate conductor overlying a major surface of a monocrystalline semiconductor region and forming first spacers on exposed walls of the gate conductor. Using the gate conductor and the first spacers as a mask, at least extension regions are implanted in the semiconductor region and dummy spacers are formed extending outward from the first spacers. Using the dummy spacers as a mask, the semiconductor region is etched to form recesses having at least substantially straight walls extending downward from the major surface to a bottom surface, such that a substantial angle is defined between the bottom surface and the walls. Subsequently, the process is continued by epitaxially growing regions of stressed monocrystalline semiconductor material within the recesses. Then the dummy spacers are removed and the transistor can be completed by forming source/drain regions of the transistor that are at least partially disposed in the stressed semiconductor material regions.

20 Claims, 5 Drawing Sheets

TRANSISTOR HAVING V-SHAPED EMBEDDED STRESSOR

BACKGROUND OF THE INVENTION

1. Field of the Invention

The present invention relates to semiconductor devices and their manufacture, and more specifically to a structure and method of making a field effect transistor (FET) having an embedded stressor.

2. Description of the Related Art

The industry trend in semiconductor technology is to create smaller devices that are faster than their predecessors. Reduced power consumption on chips is another crucial issue that drives innovation in this area. In this regard, complementary-metal-oxide-semiconductor (CMOS) circuits have become prevalent because of reduced power requirement and size. CMOS circuits often use a combination of p-type and n-type metal-oxide-semiconductor field effect transistors (MOSFETS) to implement logic gates and other circuit functions. It has been found that improved performance and reduced power requirement can be obtained when a stress is applied to the channel region of a MOSFET transistor to create a strain therein. A combination of silicon and silicon-germanium alloys have been used to induce a beneficial strain in transistors of CMOS circuits. Recently, an improved process referred to as embedded silicon germanium technique has been implemented with benefits to performance and reduced power.

The embedded silicon germanium technique involves forming trenches adjacent to extension regions 126 of a transistor and growing an epitaxial layer of silicon germanium therein. In an example of a prior art FET 190 depicted in FIG. 1, embedded silicon germanium stressor regions 135 can have substantially straight walls 122 adjacent to extension regions 126. The extension regions can be adjacent to a channel region 120 under a gate 128 of the transistor. The walls 122 extend in a vertical direction 124 (i.e., at a direction normal to a major surface 104 of the active semiconductor region) to a bottom surface 141, the bottom surface being at a depth below the major surface 104. The stressor regions 135 may be "overfilled" in that they can extend to a height 155 above the major surface 104.

The prior art PFET design as shown in FIG. 1 can pose practical design challenges. When the vertically extending walls 122 of the stressor regions are close to the channel region 120, outdiffusion of a dopant (typically boron for a PFET) from the stressor regions 135 can degrade short channel effects. If a SiGe buffer layer having a germanium concentration below the germanium concentration of the stressor regions 135 is disposed between the extension regions and the stressor regions, it can be difficult to perform a correct linkup implant to electrically connect the extension region, the buffer layer and the stressor region.

The vertical walls 122 can also allow crystal defects to occur in unwanted locations which are apart from the planes in which the vertical walls are disposed. Further improvements in the structure and fabrication of embedded silicon germanium FETs are desirable.

SUMMARY OF THE INVENTION

According to an aspect of the invention, a semiconductor device and a method of making a device are provided. In the method, a gate conductor overlying a major surface of a monocrystalline semiconductor region of a substrate can be formed, after which first spacers can be formed on exposed walls of the gate conductor. Using the gate conductor and the first spacers as a mask, at least extension regions can be implanted in the semiconductor region and dummy spacers can be formed extending outward from the first spacers. Using the dummy spacers as a mask, the semiconductor region can be etched to form recesses having at least substantially straight walls extending from the major surface to a bottom surface at a substantial angle with respect to a normal direction to the bottom surface. The process can include epitaxially growing regions of stressed monocrystalline semiconductor material within the recesses. Then the dummy spacers can be removed and the transistor can be completed by forming source/drain regions which are at least partially disposed in the stressed semiconductor material regions.

According to another aspect of the invention, a method is provided for making a semiconductor device. Such method can include: forming a gate conductor overlying a major surface of a monocrystalline active semiconductor region of a substrate; forming first spacers on exposed walls of the gate conductor; using the gate conductor and the first spacers as a mask, implanting at least extension regions in the active semiconductor region; forming dummy spacers extending outward from the first spacers; using the dummy spacers as a mask, etching the active semiconductor region to form recesses; epitaxially growing stressor regions of stressed monocrystalline semiconductor material within the recesses, the regions including a relatively high germanium concentration region and having at least substantially straight walls extending downward from the major surface to a bottom surface, wherein the walls are oriented at a substantial angle with respect to a normal to the major surface; removing the dummy spacers; and completing the transistor, wherein source/drain regions of the transistor are at least partially disposed in the stressed semiconductor material regions.

DETAILED DESCRIPTION

Figure 1:
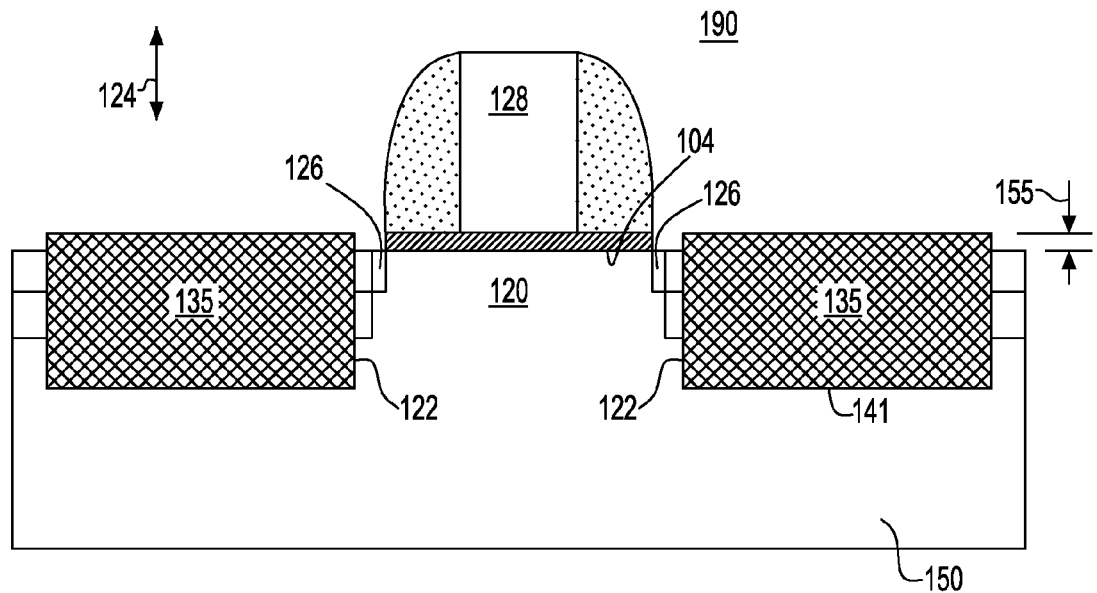
FIG. 1 is a sectional view illustrating a PFET according to the prior art, the PFET having embedded stressed semiconductor regions disposed in recesses having at least substantially vertical walls adjacent to the gate of the PFET.
Figure 2:
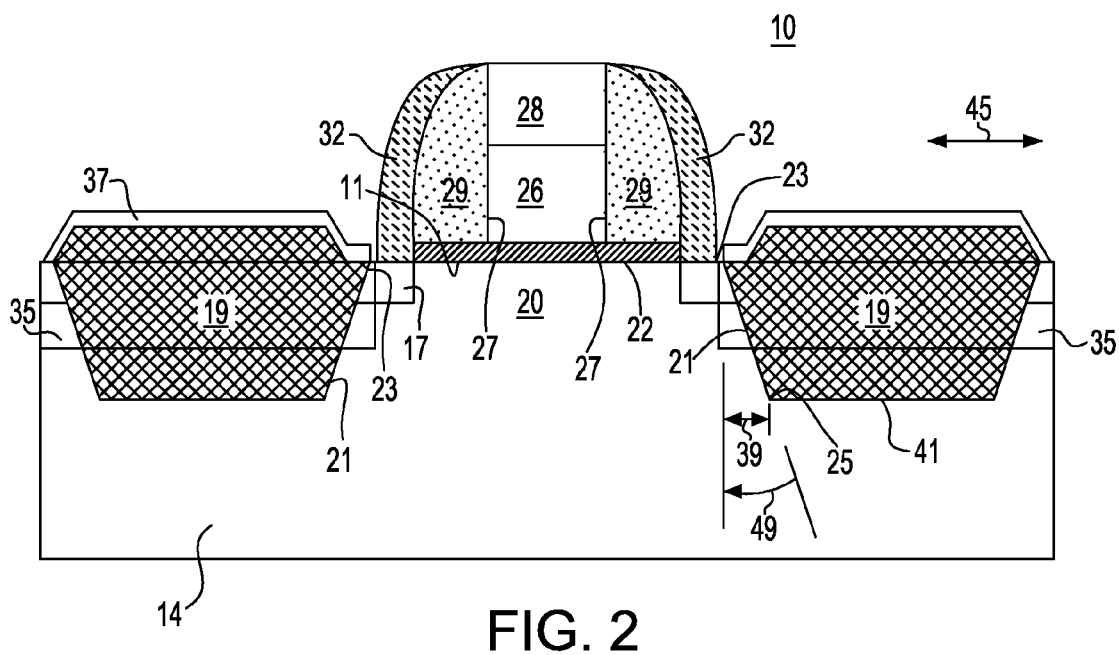
FIG. 2 is a sectional view illustrating a PFET in accordance with an embodiment of the invention, the PFET having V-shaped embedded stressor regions disposed within the active semiconductor region adjacent to edges of the gate.

FIG. 2 is a sectional view illustrating a p-type field effect transistor (PFET) 10 according to one embodiment of the present invention. As illustrated in FIG. 2, the PFET 10 can have a conduction path provided in a mono crystalline semiconductor region of a substrate 14. The substrate 14 may either be a bulk substrate or can be a semiconductor-on-insulator or silicon-on-insulator (SOI) substrate in which a relatively thin layer of a mono crystalline semiconductor is formed over an insulating layer (not shown). When field effect transistors (FETs) are formed in such SOI substrates, faster switching operation is often achieved than otherwise, because junction capacitance between the channel region of the transistor and the bulk substrate can be eliminated. As described in this and the embodiments to follow, reference will be made to fabrication of transistors within a monocrystalline region of a substrate consisting essentially of silicon, which can have embedded stressor regions of silicon alloy material, e.g., silicon alloyed with germanium, for example. However, the principles provided herein may be applied to the fabrication of transistors in other types of semiconductors such as III-V compound semiconductors, e.g. gallium arsenide (GaAs).

The performance of field effect transistors can be improved when the substrate is stressed. Applying a stress to the transistor channel can increase the mobility of carriers within the transistor and, ultimately can improve performance and reduce power consumption. In a PFET, a compressive stress can be applied to the channel region to obtain such benefits, while in an NFET, a tensile stress can be applied to the channel region. In one embodiment, PFETs can have pitch (poly-conductor to poly-conductor) of about 130 nanometers. The intrinsic eSiGe stress can be approximately −1.6 GPa for PFETs with embedded SiGe regions having 20% Ge concentration. The intrinsic stress can be approximately −500 MPa such as for a 6 nanometer cSiGe with a 25 percent Ge concentration. The intrinsic silicide stress can be approximately +500 MPa.

As shown in FIG. 2, the PFET 10 includes a channel region 20, which can be disposed along a major surface 11 of an active semiconductor region 14. The major surface can adjoin a gate dielectric layer 22 of the PFET, for example. Directly adjacent to the gate dielectric layer 22 can be the gate. The gate can include a polysilicon portion 26, for example. The polysilicon portion 26 can be heavily doped to a concentration of about $10^{19}$ cm$^{-3}$. The polysilicon portion 26 may include a p-type dopant such as boron for the purpose of matching the work function of the p-type conduction channel that exists when the PFET is turned on in operation. The gate can also include a low-resistance portion 28 disposed above the polysilicon portion 28, i.e., at a distance spaced from a gate dielectric layer 22 of the transistor. The low-resistance portion 28 has much less resistance than the polysilicon portion 26, and can include a metal, a silicide of a metal, or both. In a preferred embodiment, the low-resistance portion 28 includes a silicide such as a silicide of cobalt (CoSi). Alternatively, in place of a part or all of the polysilicon portion, the gate conductor can include a metal gate contacting the gate dielectric layer.

Silicide regions 37 can overlie source-drain regions 35 disposed in a single-crystal semiconductor region adjacent to the gate 26 and can be self-aligned in lateral directions 45 with the source-drain regions 35. Each of the source-drain regions 35 can be at a distance from the gate 26, and can be spaced therefrom by a pair of spacers 29 and 32. Spacers 29 and 32 can be formed of silicon nitride, silicon oxide, some combination thereof, or another dielectric material.

A pair of V-shaped embedded stressor elements 19 can be disposed in the active semiconductor region at locations spaced a distance from edges 27 of the gate 26. The stressor elements typically consist essentially of monocrystalline semiconductor material and typically contain an alloy of silicon with another semiconductor material, for example, silicon germanium. The embedded stressor elements can have downwardly extending surfaces 21 which adjoin corresponding downwardly extending internal surfaces of the active semiconductor region 14. The embedded stressor elements can also have laterally extending bottom surfaces 41. The bottom surfaces can extend in directions which are at least substantially parallel to a major surface 11 of the active region.

In one embodiment, the edge 23 of the embedded stressor element 19 at the major surface 11 of the active semiconductor region can be spaced a distance 39 from the junction between the downwardly extending surface 21 of the stressor element and the bottom surface 41 of the stressor element 19. In a particular example, the downwardly extending surface 21 of the stressor element can be oriented at a substantial angle with respect to a normal 43 to the major surface 11. In one embodiment, that angle can be 22 degrees.

Figure 3:
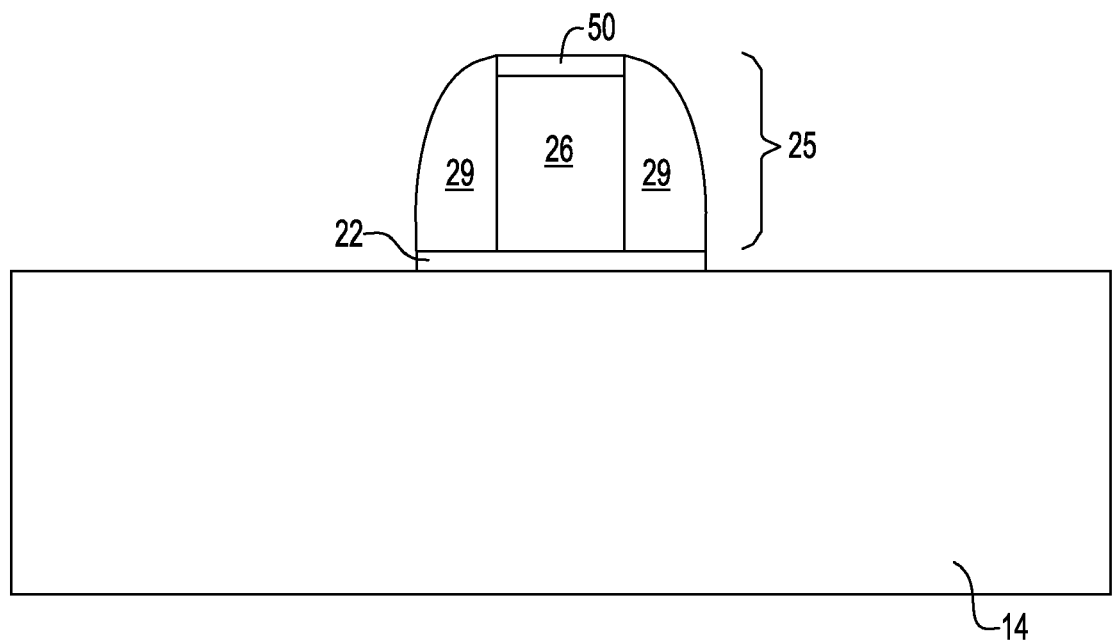
FIG. 3 is a sectional view illustrating a stage in a method of fabricating a field effect transistor in accordance with an embodiment of the invention.

An example of a method of fabricating the PFET 10 will now be discussed with reference to FIGS. 3 through 7. FIG. 3 is a sectional view illustrating a stage in a method of fabricating a PFET 10 such as depicted in FIG. 2. As shown in FIG. 3, a PFET gate stack 25 is formed overlying a single-crystal region 14 of a substrate. The single-crystal region 14 can consist essentially of a first semiconductor material such as silicon. The PFET gate stack 25 can include a gate dielectric layer 22 overlying the single-crystal region 14, and a gate conductor 26. The gate conductor layer 26 may or may not be doped with a desired dopant type and concentration to achieve a desired work function. For example, in one embodiment, the PFET gate stack may be provided with a p+ doped gate conductor layer 26. A pair of first spacers 29 can be formed on sidewalls of the gate conductor layer 26 disposed over the gate dielectric layer 22. The first spacers 29 can be formed using a blanket deposition of a conformal layer of dielectric material such as silicon nitride. The dielectric layer can then be selectively removed except where disposed along up-down oriented surfaces where spacers are to remain, such as by a reactive ion etch (RIE). An insulating cap 50 can be formed atop the gate conductor layer 26.

Figure 4:
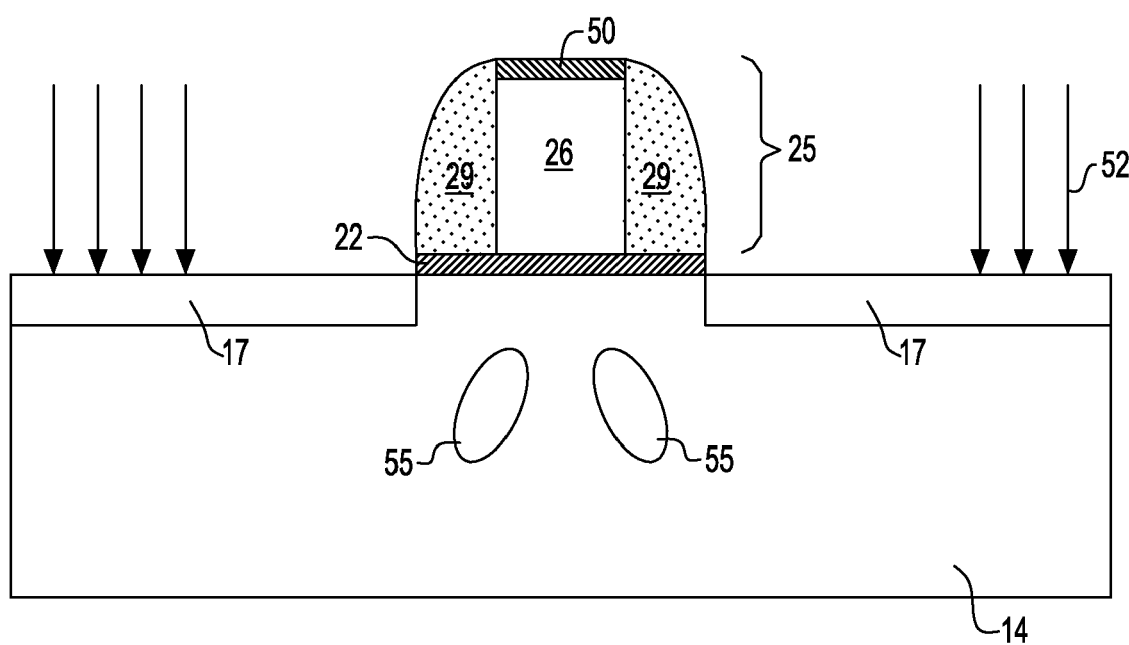
FIG. 4 is a sectional view illustrating a stage subsequent to that shown in FIG. 3 in a method of fabricating a field effect transistor in accordance with an embodiment of the invention.

As seen in FIG. 4, gate conductor 26 and the first spacers 29 can be used as a mask when conducting implants (52) needed to form extension regions 17 extending from the major surface 11 of the active semiconductor region 14 semiconductor area are implanted as indicated by the arrows. The resulting extension regions are referenced by numerals 11. An implantation step needed to form halo regions 55 can also be performed at this time, if desired.

Figure 5:
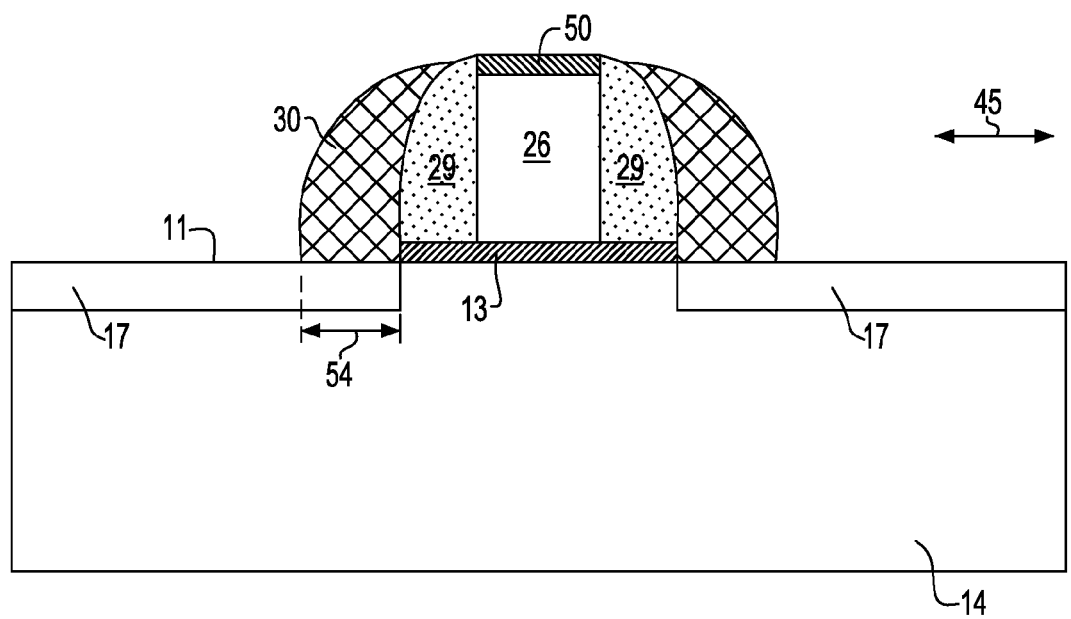
FIG. 5 is a sectional view illustrating a stage subsequent to that shown in FIG. 4 in a method of fabricating a field effect transistor in accordance with an embodiment of the invention.

A subsequent stage in fabrication is illustrated in FIG. 5. In this stage a pair of sacrificial or dummy spacers 30 can be formed extending outward from the first spacers 29. The dummy or sacrificial spacers 30 are relatively thick as shown. In one embodiment, the dummy spacers 30 can have a thickness 54 of about 300 angstroms in a lateral direction 45 along the major surface 11 of the active semiconductor region 14. As seen in FIG. 5, the dummy spacers 30 can overlie the extension regions 17.

Figure 6:
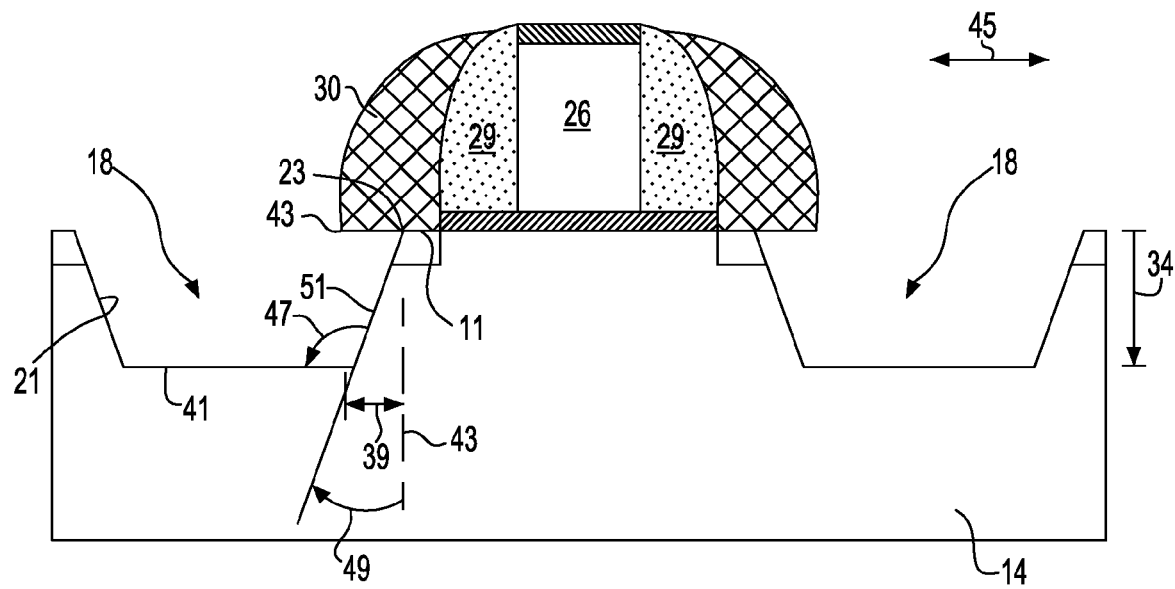
FIG. 6 is a sectional view illustrating a stage subsequent to that shown in FIG. 5 in a method of fabricating a field effect transistor in accordance with an embodiment of the invention.

FIG. 6 illustrates a processing stage subsequent to that shown in FIG. 5. In the sectional view of FIG. 6, recesses 18 can be etched into the active semiconductor region 14 adjacent to the gate 26. The etching can be performed by using the dummy or sacrificial spacers 30 as a mask. The semiconductor region 14 can be etched to form recesses 18 having at least substantially straight walls 51 extending downward from the major surface to a bottom surface 41, wherein a substantial angle 47 can be defined between the bottom surface 41 and the edge surfaces 51 of the recesses. Because of the slope in the edge surfaces, the recesses 18 can be referred to as V-shaped.

It should be noted that the area that is etched, according to one embodiment of the invention as shown extends at least below part of the area covered by the sacrificial spacers 30. In one embodiment, etching such as RIE is performed to a depth of 50 nanometers. Etching can be performed such that, wherein the etching step also removes material is also removed in a lateral, e.g., horizontal, direction 45 along the major surface 11 of the active semiconductor region 14. In one example, the etching step can be performed such that etching proceeds in a lateral direction 45 along the major surface 11 of the active semiconductor region 14. As a result, edges surfaces 23 of the recesses at the major surface 11 can extend about 20 nanometers inwardly (under the sacrificial spacers 30) from exposed edges 33 of the spacers 30. In a particular example, a wall 51 of the recess adjacent to the gate 26 can be oriented at a substantial angle 49 with respect to a normal 43 to the major surface 11. In one embodiment, that angle can be 22 degrees. In an alternative embodiment, the horizontal component of etching can be performed either before the vertical component or after the vertical component of etching is performed.

Figure 7:
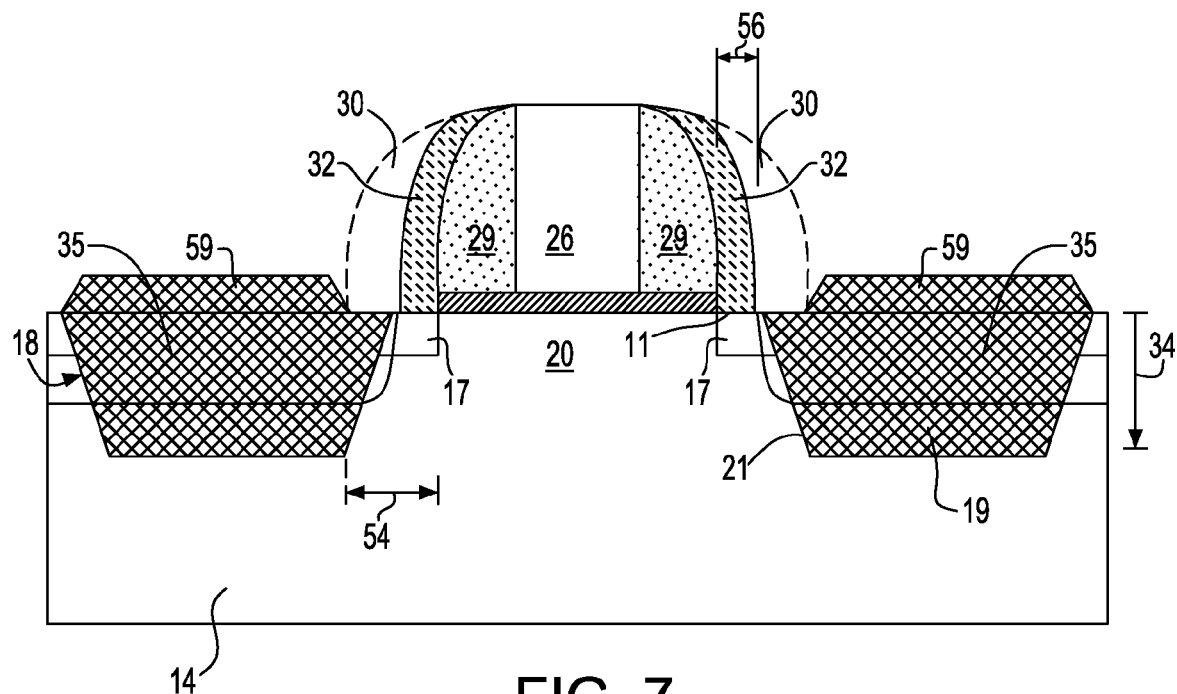
FIG. 7 is a sectional view illustrating a stage subsequent to that shown in FIG. 6 in a method of fabricating a field effect transistor in accordance with an embodiment of the invention.

FIG. 7 illustrates further processing in the fabrication of PFET 10. With the dummy spacers 30 (shown in outline form) still in place, regions of stressed monocrystalline semiconductor material can be selectively epitaxially grown from exposed surfaces within the recesses to form stressor regions 19 having edge surfaces 21 adjacent to the channel region 20. For example, regions of silicon germanium can be epitaxially grown from the exposed interior surfaces of the recesses. In one embodiment, the epitaxial regions can rise above major surface 11 of the active semiconductor region 14 to provide regions 59 of semiconductor material for forming raised source/drain regions.

Subsequently, the dielectric cap 50 and the dummy spacers 30 can be removed from the structure leaving spacers 29 on walls 27 of gate 26. Replacement spacers 32 can then be formed along exposed walls of first spacers 29. Alternatively, both pairs of spacers 29 and 30 can be removed and a pair of replacement spacers can be formed in place of spacers 29, 30. The replacement spacers have a thickness 56 which extends a shorter distance along the major surface 11 from the exposed edges of spacers 29, than the thickness 54 of the dummy spacers 30. In one embodiment, the thickness 56 of the replacement spacers 32 can be between 50 and 150 angstroms, although smaller or greater thicknesses are also possible.

After removing the dielectric cap and forming replacement spacers 32, an implantation step can be performed to define the source/drain regions 35 of the transistor. The source/drain regions 35 can be at least partially disposed in the stressed semiconductor material regions 19, 59.

Referring again to FIG. 2, silicide regions 28 and 37 can be formed such as by using a "silicide" or self-aligned silicide process in which a silicide-forming metal is deposited onto exposed surfaces of the gate 26 and exposed active semiconductor region 14 including stressor regions 19. Thereafter, the wafer can be heated to react the metal with the semiconductor material to form the silicide regions 28, 37.

One result achieved by the V-shape of the stressor regions 19 is that, at the major surface 11, the edges 23 of the stressor regions 19 can be placed in close proximity to the walls 27 of the gate 27. This helps the stressor regions 19 to produce a desirably high stress in the channel region which extends in a lateral direction 45 along the major surface 11, typically within a distance no more than a few hundred angstroms from the gate dielectric layer 22.

Another result of forming the stressor regions 19 to have V-shape can be to eliminate the need for a buffer layer near the extension regions of the PFET, due to a slower epitaxial growth in the <111> crystal orientation. This can help minimize the crystal defect formation within the stressor regions because the majority of defects are formed along a vertical line that often coincides with the substantially straight sidewalls of prior art etched areas. Another result is that it can provide the same topology as the extension region of the PFET, so that a linkup implant can be used selectively. Also, with the dummy spacers 30 (locations shown in outline form in FIG. 7) in place when the stressor regions are grown by epitaxy, the thickness 54 of the dummy spacers keep any overfill resulting from the epitaxial growth farther from the critical extension regions 17.

Keeping the overfill farther away from the gate helps address potential problems. When an overfilled semiconductor region is very close to the extension region and the gate of the transistor, high capacitance can arise between the gate and the overfilled region. The capacitance can degrade the transistor performance. Overfill can also sometimes impact transistor yield. When forming a silicide atop the source/drain regions, if the distance between the overfilled region and the gate is very small, metal used to form the silicide can sometimes intrude laterally in a direction towards the extension regions and the gate, possibly causing shorts. Keeping the overfill farther away addresses such concern.

Figure 8:
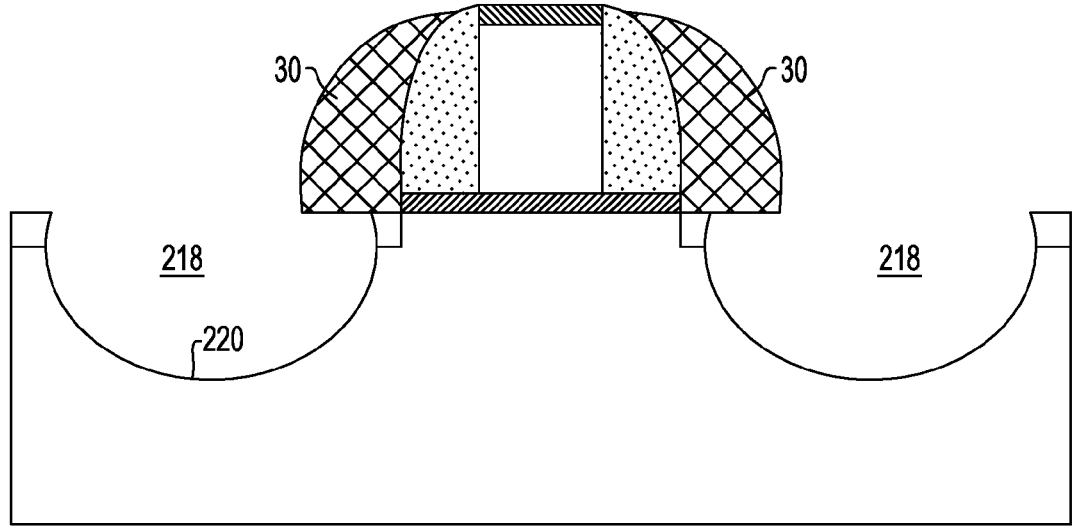
FIG. 8 is a sectional view illustrating a stage in method of fabricating a field effect transistor in accordance with a variation of the embodiment described with reference to FIGS. 2 through 7.

In a variation of the above-described embodiment, the recesses in the active semiconductor region 14 (FIG. 6) need not be formed initially to have V-shape, i.e., wherein the interior walls 51 of the recesses are disposed at a substantial angle 47 with the bottom surface 41. Instead, for example as seen in FIG. 8, the initially etched recesses 218 (FIG. 8) can have a U-shape, i.e., one in which the interior surface 220 of each recess can be continuous. U-shaped recesses can be formed by etching with a component that is at least partly isotropic in character. In one example, RIE can be used to conduct initial etching in a manner similar to that shown and described above (FIG. 6), which can then be followed by a chemical wet etch step to form recesses 218 as depicted in FIG. 6. The chemical wet etch step may be at least partly isotropic or can be fully isotropic in character. In a particular embodiment, it may be possible to use a chemical wet etch step without an initial RIE step to form the recesses 218. As in the above-described embodiment, the recesses can extend under the dummy spacers 30.

Figure 9:
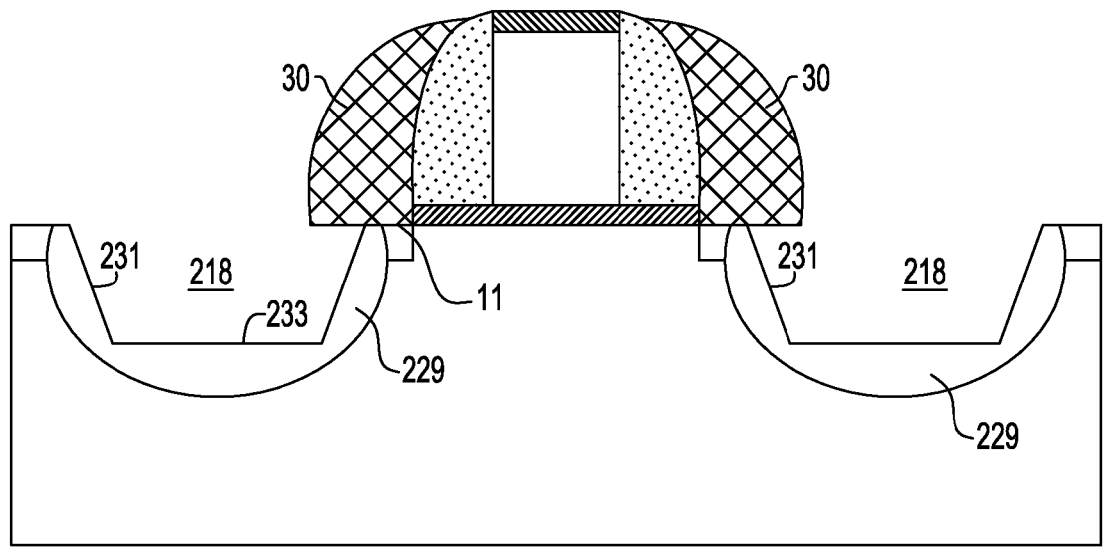
FIG. 9 is a sectional view illustrating a stage of fabrication subsequent to that shown in FIG. 8.

Thereafter, as seen in FIG. 9, a buffer layer 229 of SiGe can be epitaxially grown from the exposed interior surface of the semiconductor material within each recess. 218. Typically, the buffer layer is grown with a relatively low germanium (Ge) concentration compared to that of the stressor regions (FIG. 10) which will be subsequently formed. The epitaxial process can be controlled such that growth occurs preferentially on the <100> plane of the semiconductor crystal. In this case, the <100> plane coincides with the bottom surface of the recess 218, wherein the <100> semiconductor crystal plane of the active semiconductor region 14 is exposed. Accordingly, growth occurs preferentially from the <100> plane relative to other planes and forms an epitaxial layer 229 having flat straight walls 231 and bottom surface 233. The buffer layer 229 can extend under portions of the spacers 30. Thus, after forming the buffer layer 229, the exposed surfaces 231, 233 of each buffer layer forms a recess below the major surface 11 which can have characteristics the same as or much like those of the recesses 18 described above (FIG. 6).

Figure 10:
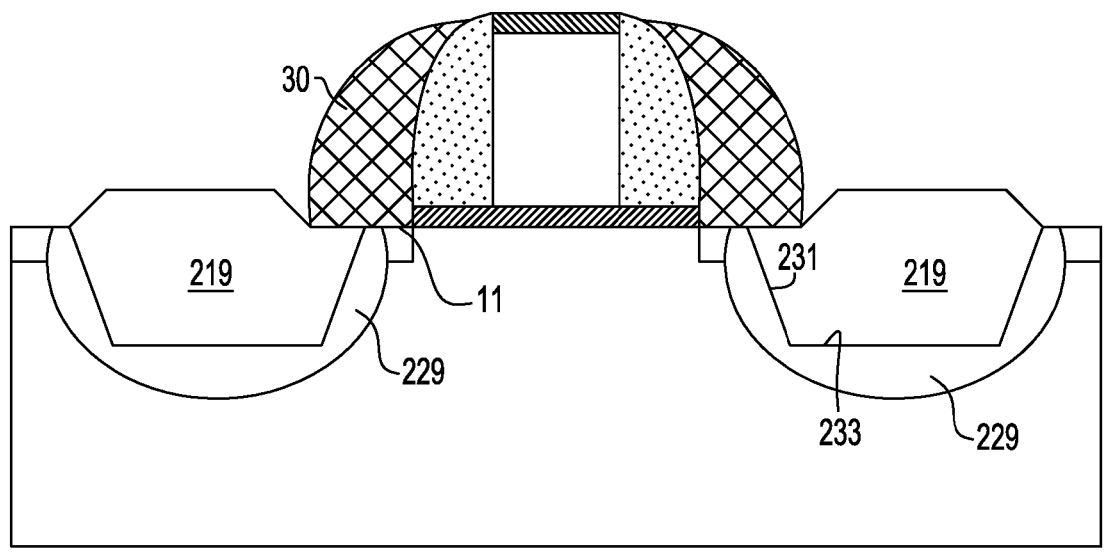
FIG. 10 is a sectional view illustrating a stage of fabrication subsequent to that shown in FIG. 9.

Thereafter, as seen in FIG. 10, higher Ge concentration SiGe regions 219 can be grown epitaxially to form stressor regions which extend away from the surfaces 231, 233 of the buffer layers and can extend under the spacers 30. The epitaxial stressor regions 219 can include raised regions extending above the major surface 11, similar to those described above (FIGS. 2, 7). The stressor regions 229 can be grown to have a germanium (Ge) concentration that is significantly higher than that of the buffer layer 219 (FIG. 9). For example, in one embodiment, the Ge concentration in the stressor regions 219 can be greater than 10% and can be significantly greater than 10%, e.g., 15% or more. In one embodiment, the concentration in the buffer layer 229 can be less than 10% and can be significantly less than 10% (i.e., 5% for example).

Further processing can be performed to complete the transistor as described above, for example, with reference to FIGS. 7 and 2. The structure of each stressor region 219 can be approximately the same as the stressor regions 19 described above with respect to FIGS. 7 and 2, and particular benefits which can arise therefrom can be the same or similar to those described above.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of making a semiconductor device, comprising:
   forming a gate conductor overlying a major surface of a monocrystalline active semiconductor region of a substrate;
   forming first spacers on exposed walls of the gate conductor;
   using the gate conductor and the first spacers as a mask, implanting at least extension regions in the active semiconductor region;
   forming dummy spacers extending outward from the first spacers;
   using the dummy spacers as a mask, etching the active semiconductor region to form recesses having at least substantially straight walls extending downward from the major surface to a bottom surface, wherein the walls are oriented at a substantial angle with respect to a normal to the major surface;
   epitaxially growing regions of stressed monocrystalline semiconductor material within the recesses;
   removing the dummy spacers; and
   completing the transistor, wherein source/drain regions of the transistor are at least partially disposed in the stressed semiconductor material regions.

2. The method of claim 1, wherein edge surfaces of the recesses define an angle of about 22 degrees with respect to the normal.

3. The method of claim 1, wherein said recesses are formed to substantially have a V-shaped structure.

4. The method of claim 1, wherein said recesses are created using a reactive ion etch (RIE).

5. The method of claim 1, wherein said recesses are formed by performing a vertical etching step and performing a horizontal etching step.

6. The method of claim 1, wherein said recesses are formed by using a reactive ion etch both for vertical and horizontal etching steps.

7. The method of claim 1, wherein said recess has a depth of about 50 nanometers.

8. The method of claim 6, wherein said recess areas are etched to extend horizontally under the dummy spacer region.

9. The method of claim 8, wherein said recesses extend laterally inward about 20 nanometers from exposed edges of said dummy spacers.

10. The method of claim 1, wherein said dummy spacer has a thickness of about 300 angstroms.

11. A method of making a semiconductor device, comprising:
    forming a gate conductor overlying a major surface of a monocrystalline active semiconductor region of a substrate;
    forming first spacers on exposed walls of the gate conductor;
    using the gate conductor and the first spacers as a mask, implanting at least extension regions in the active semiconductor region;
    forming dummy spacers extending outward from the first spacers;
    using the dummy spacers as a mask, etching the active semiconductor region to form recesses;
    epitaxially growing stressor regions of stressed monocrystalline semiconductor material within the recesses, the regions including a relatively high germanium concentration region and having at least substantially straight walls extending downward from the major surface to a bottom surface, wherein the walls are oriented at a substantial angle with respect to a normal to the major surface;
    removing the dummy spacers; and
    completing the transistor, wherein source/drain regions of the transistor are at least partially disposed in the stressed semiconductor material regions.

12. The method of claim 11, wherein each recess has a U-shaped interior, wherein walls and a bottom surface of the recess are rounded.

13. The method of claim 12, wherein each recess has a continuous interior surface.

14. The method of claim 12, further comprising epitaxially growing buffer layers within the recesses prior to growing the stressor regions, the buffer layers having a relatively low germanium concentration relative to the stressor regions.

15. The method of claim 14, wherein edge surfaces of the stressor regions define an angle of about 22 degrees with respect to the normal.

16. The method of claim 12, wherein said stressor regions are formed to substantially have a V-shaped structure.

17. The method of claim 12, wherein said recesses have depth of about 50 nanometers.

18. The method of claim 12, wherein said recess areas are etched to extend horizontally under the dummy spacers.

19. The method of claim 18, wherein said recesses extend laterally inward about 20 nanometers from exposed edges of said dummy spacers.

20. The method of claim 19, wherein said dummy spacer has a thickness of about 300 angstroms.

* * * * *